(12) United States Patent
Dupcak et al.

(10) Patent No.: US 6,653,869 B2
(45) Date of Patent: *Nov. 25, 2003

(54) UNIVERSAL CMOS SINGLE INPUT, LOW SWING SENSE AMPLIFIER WITHOUT REFERENCE VOLTAGE

(75) Inventors: Robert J. Dupcak, Framingham, MA (US); Randy L. Allmon, Hopedale, MA (US); Mark D. Matson, Acton, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/077,194

(22) Filed: Feb. 15, 2002

(65) Prior Publication Data

US 2002/0125916 A1 Sep. 12, 2002

Related U.S. Application Data

(62) Division of application No. 09/241,496, filed on Feb. 1, 1999, now Pat. No. 6,414,520.

(51) Int. Cl.[7] .............................................. G01R 19/00
(52) U.S. Cl. ............................ 327/52; 327/57; 365/207
(58) Field of Search ........................ 327/50–57, 63–65; 365/189.11, 207, 208, 189.05, 205, 195, 196

(56) References Cited

U.S. PATENT DOCUMENTS

| | | | | |
|---|---|---|---|---|
| 4,910,713 A | | 3/1990 | Madden et al. | 365/189.11 |
| 5,055,720 A | * | 10/1991 | Tiede | 327/53 |
| 5,473,567 A | * | 12/1995 | McClure | 327/51 |
| 5,594,696 A | * | 1/1997 | Komarek et al. | 327/52 |
| 5,796,273 A | * | 8/1998 | Jung et al. | 327/55 |
| 6,201,418 B1 | | 3/2001 | Allmon | 327/52 |
| 6,414,520 B1 | | 7/2002 | Dupcak et al. | 327/52 |

OTHER PUBLICATIONS

Chuang, Ching–Te et al., "SOI for Digital CMOS VLSI: Design Considerations and Advances," Proceedings of the IEEE, 86(4): 689–720 (Apr. 1998).
Glasser, Lance A., and Dobberpuhl, Daniel W., "The Design and Analysis of VLSI Circuits," (MA: Addison–Wesley), pp. 286–289 (1985).
Matson, M., et al., "A 600 Mhz Superscalar Floating Point Processor," Paper on EV6 Fbox given at European Solid–State Circuits Conference, Sep. 1998.
Montanaro, James, et al., "A 160–Mz, 32–b, 0.5–W CMOS RISC Microprocessor," IEEE Journal of Solid–State Circuits, 31(11) 1703–1747, Nov. 1996.
Jiang, June et al., "High–Performance, Low–Power Design Techniques for Dynamic to Static Logic Interface," Proceedings 1997 International Symposium on Low Power Electronics and Design, Monterey, CA Aug. 18–20, 1997, pp. 12–17.

* cited by examiner

*Primary Examiner*—Minh Nguyen

(57) ABSTRACT

A sense amplifier is provided for sensing an input voltage level of a data signal. Such a sense amplifier pre-charges, and subsequently discharges, a pair of nodes through a respective pair of discharge paths. Each of those discharge paths is capable of performing the discharge operation at a rate that is related to either a system voltage supply or an input logic level of the data signal. Because the discharge path that is associated with the data signal includes a greater amount of conductance, it can perform the discharge operation at a faster rate, even where the input logic level does not exceed the voltage of the system voltage supply. A determination is made as to which of the discharge is the faster and, responsively, a rail-to-rail output signal having the same polarity as the data signal, is generated. The input data signal is conveyed to the sense amplifier by a single wire. Also, the sense amplifier does not require a specialized reference voltage for proper operation. Rather, it uses the same voltage supply that is used to power the rest of the circuit. Accordingly, such an approach uses less area, consumes less power and has greater noise immunity.

14 Claims, 14 Drawing Sheets

_US 6,653,869 B2_

UNIVERSAL CMOS SINGLE INPUT, LOW SWING SENSE AMPLIFIER WITHOUT REFERENCE VOLTAGE

RELATED APPLICATION(S)

This application is a divisional of U.S. application Ser. No. 09/241,496, filed Feb. 1, 1999, now U.S. Pat. No. 6,414,520. The entire teachings of the above application(s) are incorporated herein by reference.

BACKGROUND OF THE INVENTION

Generally speaking, computer systems typically include one or more central processor units (CPUs). In order to reduce power consumption and increase the performance of those CPUs, selected signals are operated in a "low voltage swing" manner. Low voltage swing signals typically represent digital data with a representative voltage that is less than the supply voltage (Vdd) level. Low swing voltage signals are typically generated in true/complement pairs, referred to as "differential" pairs. The prior art sense amplifiers operate by sensing the voltage differential between the true/complement pair to determine the logic level of the signal.

For example, the circuitry of a CPU may be powered by a Vdd supply voltage of 2.0 Volts. An associated pair of low voltage swing signals may develop a voltage differential of only +0.2 Volts to represent logic high data and −0.2 Volts to represent logic low data. Such low voltage swing signals can increase performance because the amount of time to generate a voltage differential of 0.8 Volts is significantly shorter than to transition that signal from 2.0 to 0 Volts. A signal that transitions from 2.0 to 0 Volts (i.e., from Vdd to Vss) is referred to as a "rail-to-rail" signal.

While low voltage swing signals present benefits to a CPU, they also add additional design requirements. For example, CPUs that employ low voltage swing signals, such as to represent data read from hardware registers, typically include amplifiers referred to as "sense amplifiers" for detecting the logic levels of those low voltage swing signals. When such a register is accessed, data that is stored therein is presented to the sense amplifier. That sense amplifier is designed to detect the logic levels of the low swing voltage signals and convert them to rail-to-rail voltage signals. Those rail-to-rail voltage signals can be input to other circuits that operate on the data, for example the CPU's floating point data store unit.

Such sense amplifiers are replicated many times in a typical CPU. Accordingly, the size of each device is critical to the total area used by such a CPU. Further, the chip real estate that each sense amplifier consumes reduces the total area available for other devices.

In the past, sense amplifiers have included at least two input stages connected to a corresponding number of data lines. Those input stages are connected to each signal of a true/complement or differential pair. The differential pairs are conveyed by wires across relatively large distances from the sourcing location to the destination location, e.g. the sense amplifier. Accordingly, those wires must be physically wide enough to present as little resistance as possible to the low swing voltage signals, such that the voltage levels are not degraded. Because those wires are connected to the inputs of each sense amplifier, they significantly increase the amount of real estate that is used by the floating point unit.

Prior art approaches to reducing the area of such sense amplifiers have used a reference voltage supply circuit. The reference voltage supply circuit is used as a reference to determine the logic level of an associated low voltage swing signal. Such an approach poses area, power consumption, process tracking and electrical noise concerns.

SUMMARY OF THE INVENTION

Generally, the sense amplifier of the present invention senses the logic level of data that is conveyed using a low voltage swing signal. The data is input to the sense amplifier by a single wire. Also, the sense amplifier does not require a specialized reference voltage for proper operation. Rather, it uses the same voltage supply that is used to power the rest of the circuit. Accordingly, the area used by the sense amplifier is significantly reduced.

More specifically, a method is provided for sensing an input voltage level of a data signal. Such a method involves pre-charging, and subsequently discharging, a pair of nodes through a respective pair of discharge paths. Each of those discharge paths is capable of performing the discharge operation at a rate that is related to either a chip voltage supply or an input logic level of the data signal. Because the discharge path that is associated with the data signal includes a greater amount of conductance (i.e., conductance capacity), it can perform the discharge operation at a faster rate, even where the input logic level does not exceed the voltage of the system voltage supply. A determination is made as to which of the discharges is the fastest and, responsively, a rail-to-rail output signal having the same polarity as the data signal, is generated.

With such a structure, the data signal is conveyed to the sense amplifier by a single wire. Also, the sense amplifier does not require a specialized power supply for proper operation. Rather it uses the same power supply that is used to power the rest of the circuit. Accordingly, the area used by the sense amplifier is significantly reduced.

In a further aspect of the present invention, the discharge operation associated with one of the nodes, that is discharging at a faster rate, is allowed to continue while the discharge operation associated with the other node is terminated. Accordingly, the method allows the sensing operation to operate using a single data signal. Therefore, the semiconductor area that is used to practice the sensing operation is significantly reduced.

The input data signal may be a single low voltage swing signal. The sense amplifier may also include a pull-up unit coupled to the internal signal nodes for pulling the node that is discharged at a slower rate to a high logic level.

Further, the sense amplifier may include an evaluate unit, such as a transistor, connected to an electrical ground and to the pair of discharge paths for conveying the charge to electrical ground, and for initiating that conveyance when the input data signal achieves a voltage level that is capable of being resolved by the sense amplifier.

Further still, one of the discharge paths may include a pair of transistors connected in series by one of the internal signal nodes. That structure is connected in parallel with another, similar series connection of transistors. The input data signal is connected thereto.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Generally, the sense amplifier of the present invention senses the logic value of digital data that is conveyed using a low voltage swing differential pair of signals. The digital data is input to the sense amplifier by a single low voltage swing wire. Accordingly, the area used by the sense amplifier is significantly reduced.

I. A Computer System

Figure 1:
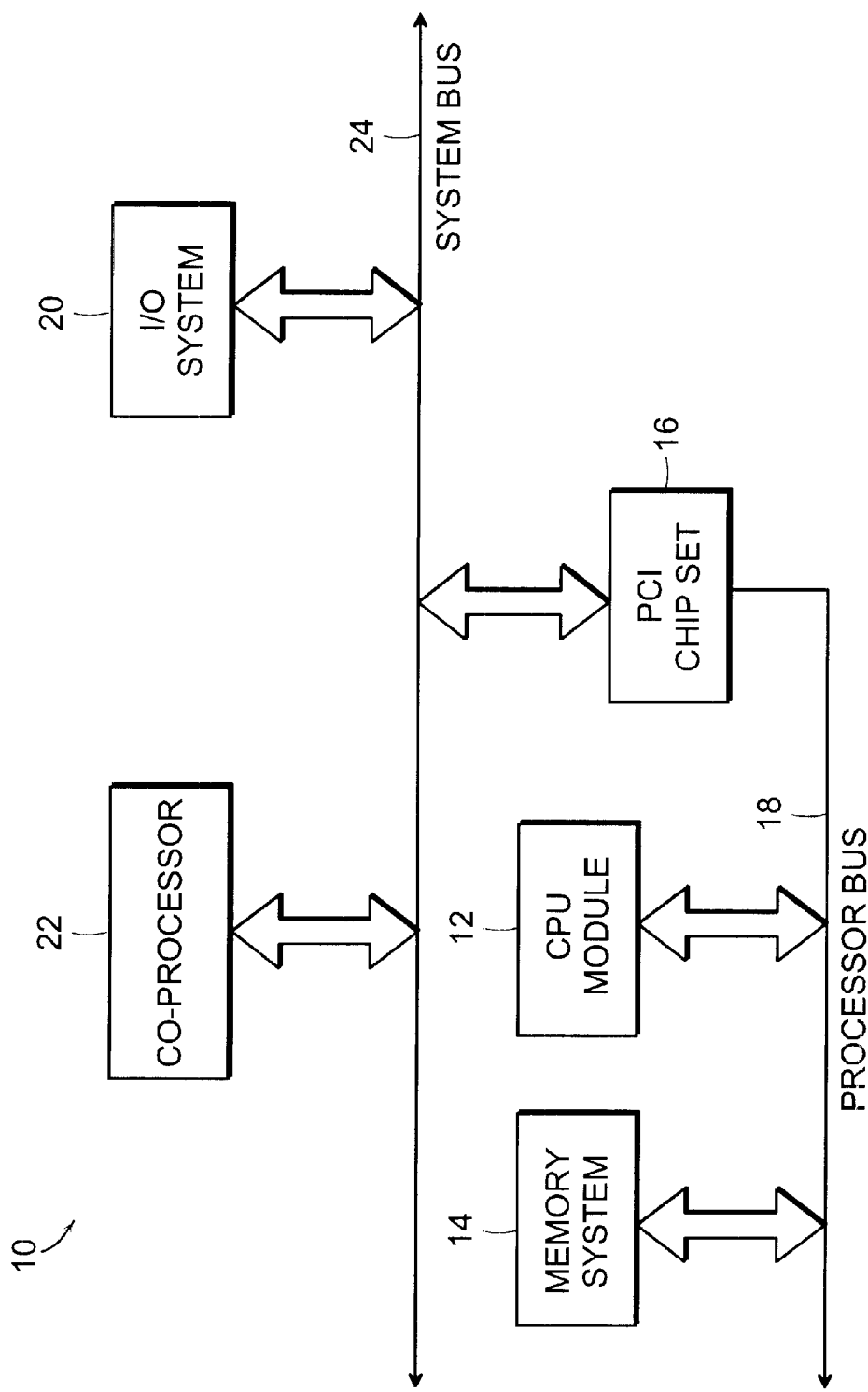
FIG. 1 is a schematic drawing of a computer system including a central processing module, in which the present invention can be used.

FIG. 1 is a schematic diagram of a computer system 10 that includes a central processing unit (CPU) module 12, a memory system 14 and a PCI chip set 16 connected by a processor bus 18. The PCI chip set 16 is further connected to an I/O system 20 and a co-processor module 22 by a system bus 24. Central processing module 12 can include a number of sense amplifiers for use with low voltage swing signals according to the present invention.

Figure 2:
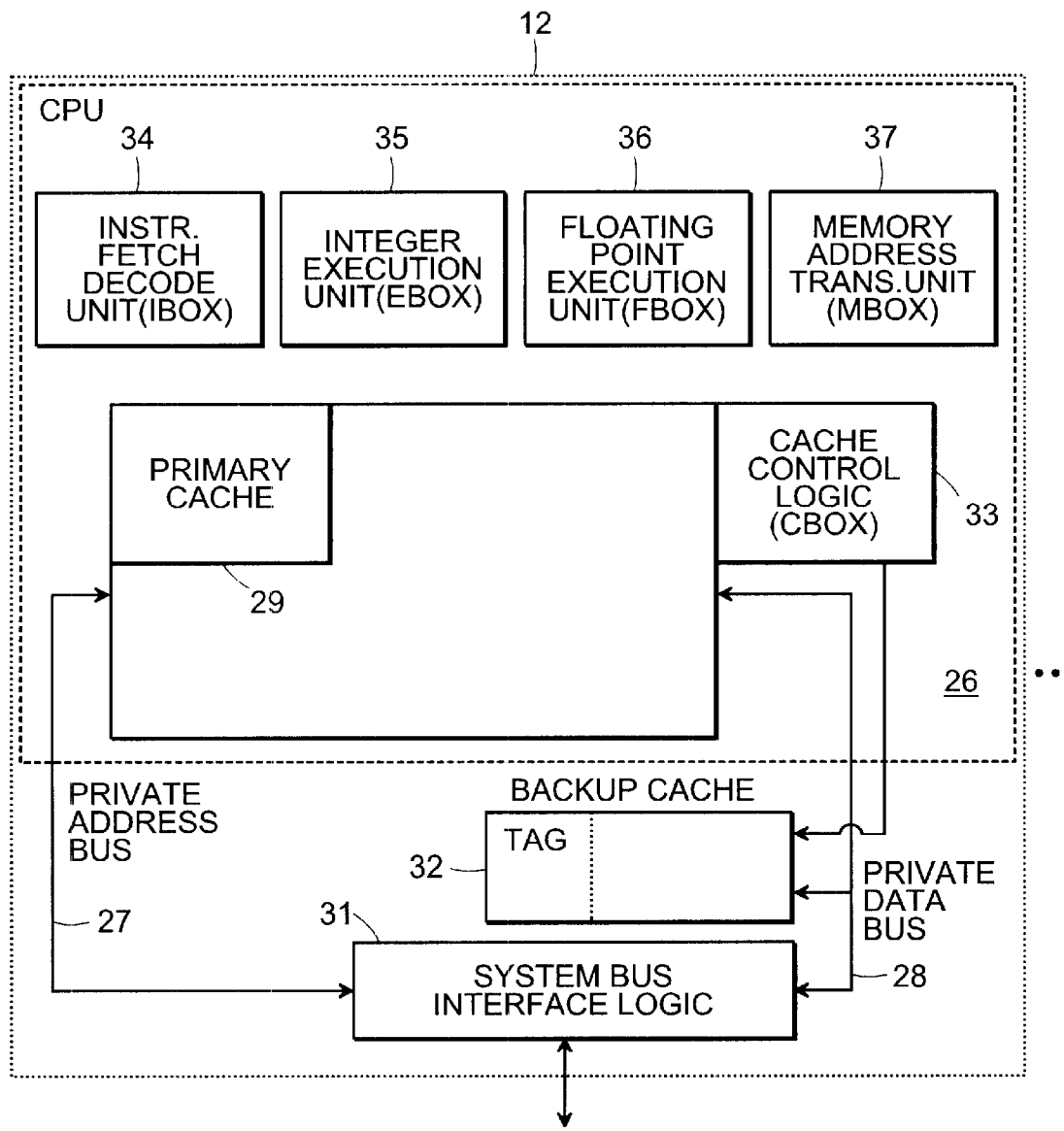
FIG. 2 is a schematic diagram of the central processing module of FIG. 1.

Referring now to FIG. 2, central processing module 12 is shown to include a CPU 26. A private address bus 27 and a private data bus 28 within CPU 26 connects a primary cache 29 and a system bus interface 31. The private data bus 28 connects the CPU 26 to a backup cache (Bcache) 32 that, along with the primary cache 29, is controlled by the Cache Control and Bus Interface unit 33.

CPU 26 further includes several logic circuits that enable it to perform the major operations that the computer system 10 requires. The Ibox 34, or Instruction Fetch and Decode Unit, controls instruction prefetching, instruction decoding, branch prediction, instruction issuance, and interrupt handling. The Ebox 35, or Integer Execution Unit, handles the functions of addition, shifting, byte manipulation, logic operations, and multiplication for integer values stored in the system. These same operations, for floating point values, are controlled by the Fbox 36, or Floating Point Execution Unit. The Mbox 37, or Memory Address Translation Unit, translates virtual addresses, generated by programs running on the system, into physical addresses which are used to access locations in the computer system. Lastly, the Cbox 33, or Cache Control and Bus Interface Unit, controls the primary cache 29 and backup cache 32. It also controls the private data bus, private address bus, memory related external interface functions, and all accesses initiated by the Mbox 37.

Each of the circuits mentioned above can include sense amplifiers to detect and latch logic levels of received data signals. Accordingly, sense amplifiers are widely used in many different areas of CPU module 12.

II. Floating Point Register

Figure 3A:
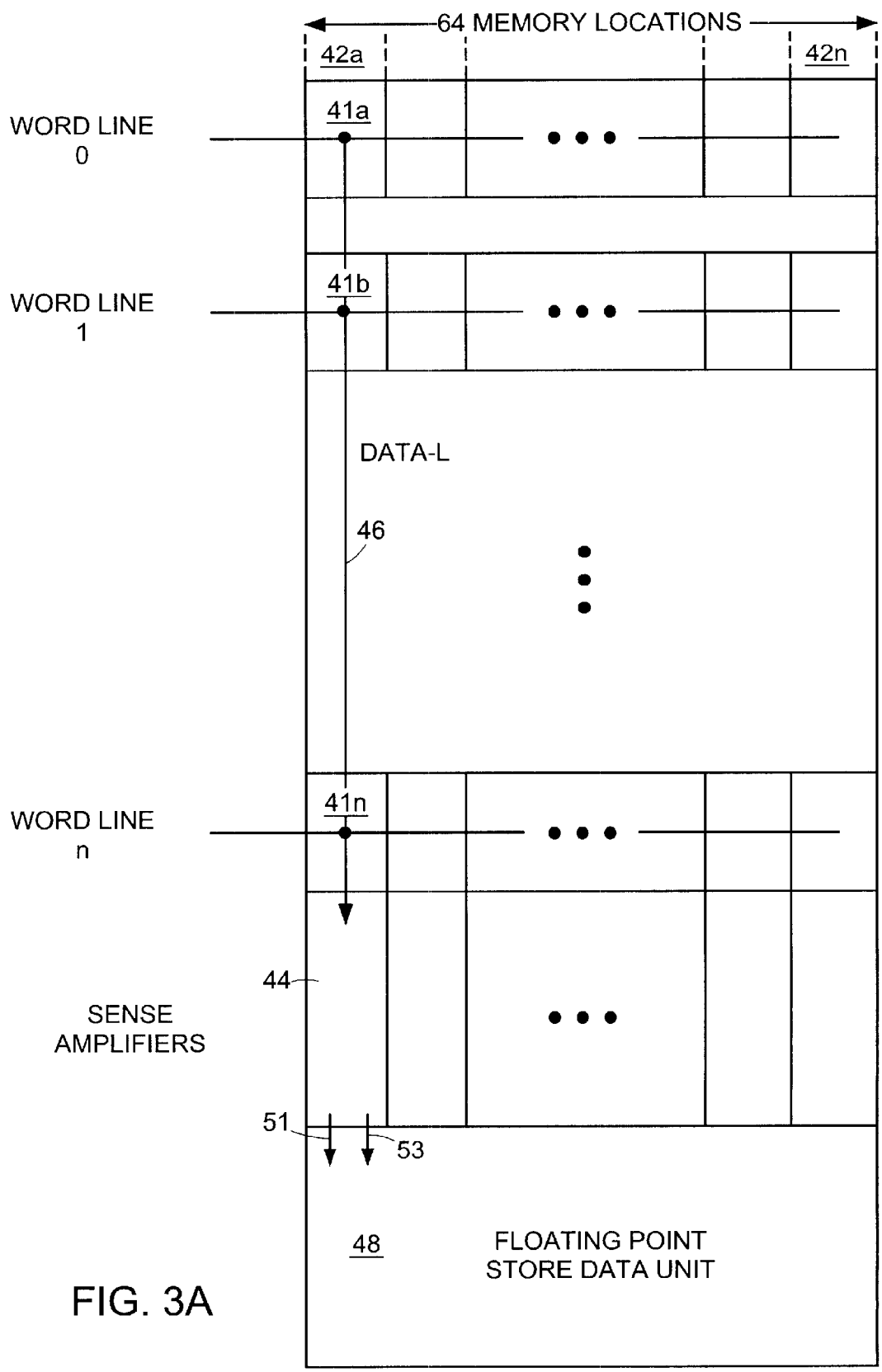
FIG. 3A is a block diagram of the floating point register unit of the FBOX unit of the central processing unit of FIG. 2.
Figure 3B:
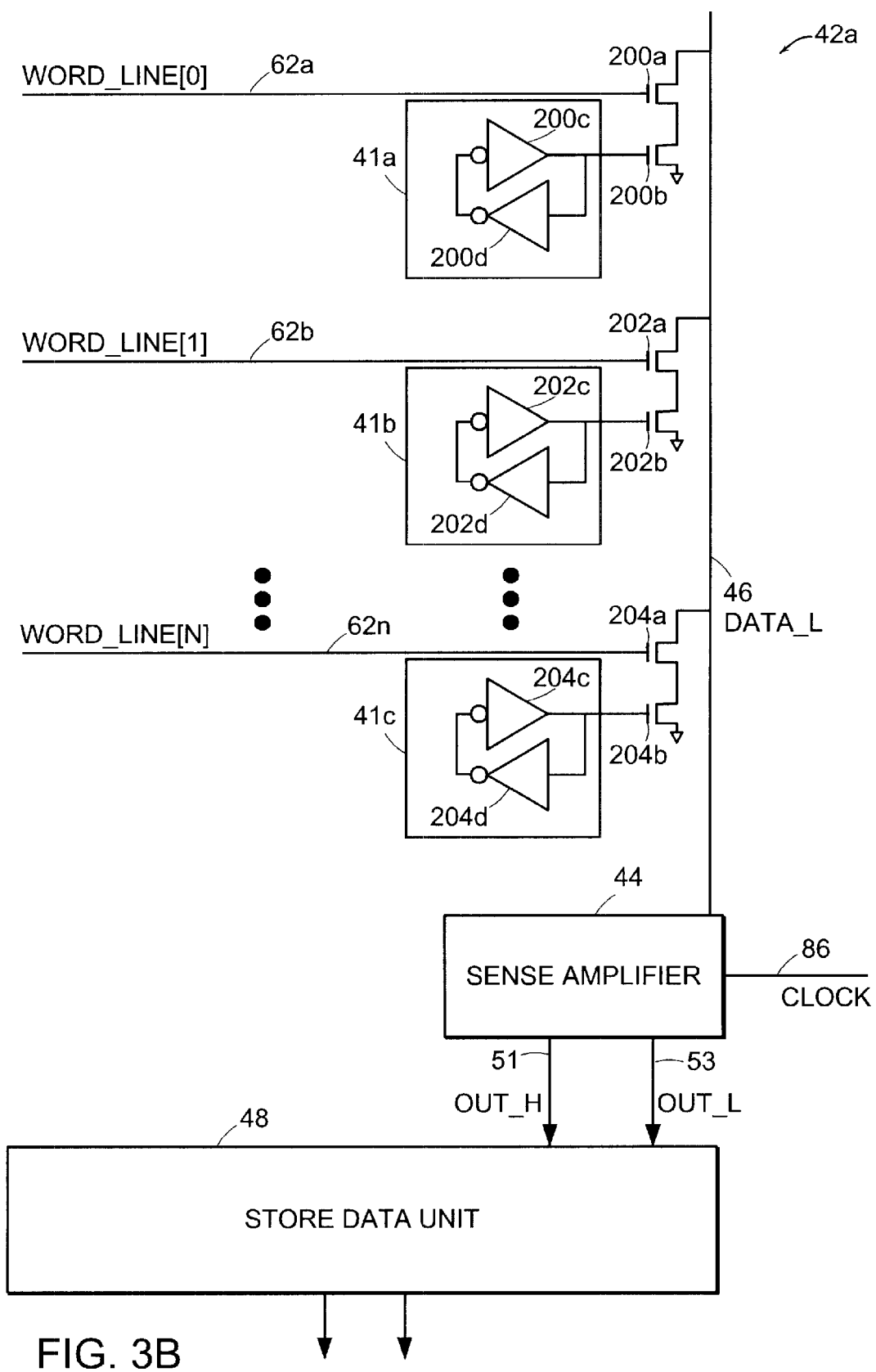
FIG. 3B is a more detailed block diagram of one portion of the floating point unit of FIG. 3A.

FIG. 3A is a block diagram of the floating point register 40 of the Fbox unit 36. The floating point register unit 40 includes sixty-six columns of memory locations 42a–42n. Referring now to FIG. 3B, one of those columns 42a is shown connected to a sense amplifier 44 by data_1 signal line 46.

Generally, when a read operation is initiated, the word line signal 62 that is associated with the desired memory locations is asserted. When a memory location, such as location 41a, detects the assertion of the word line signal 62a, transistor 200a IS responsively turned-on. The logic level of the data stored by the circularly connected inverters 200c and 200d causes transistor 200b to either turn-on or turn-off. Accordingly, a corresponding logic level is imposed on the data_1 signal 46. The data is conveyed to sense amplifier 44. When the sense amplifier 44 senses that the data has been imposed on data_1 46, it responsively generates a rail-to-rail voltage on signals out_h 51 and out_1 53. Signals out_h 51 and out_1 53 subsequently convey those rail-to-rail voltages to the floating point store data unit 48.

III. An Inventive Sense Amplifier

Figure 4:
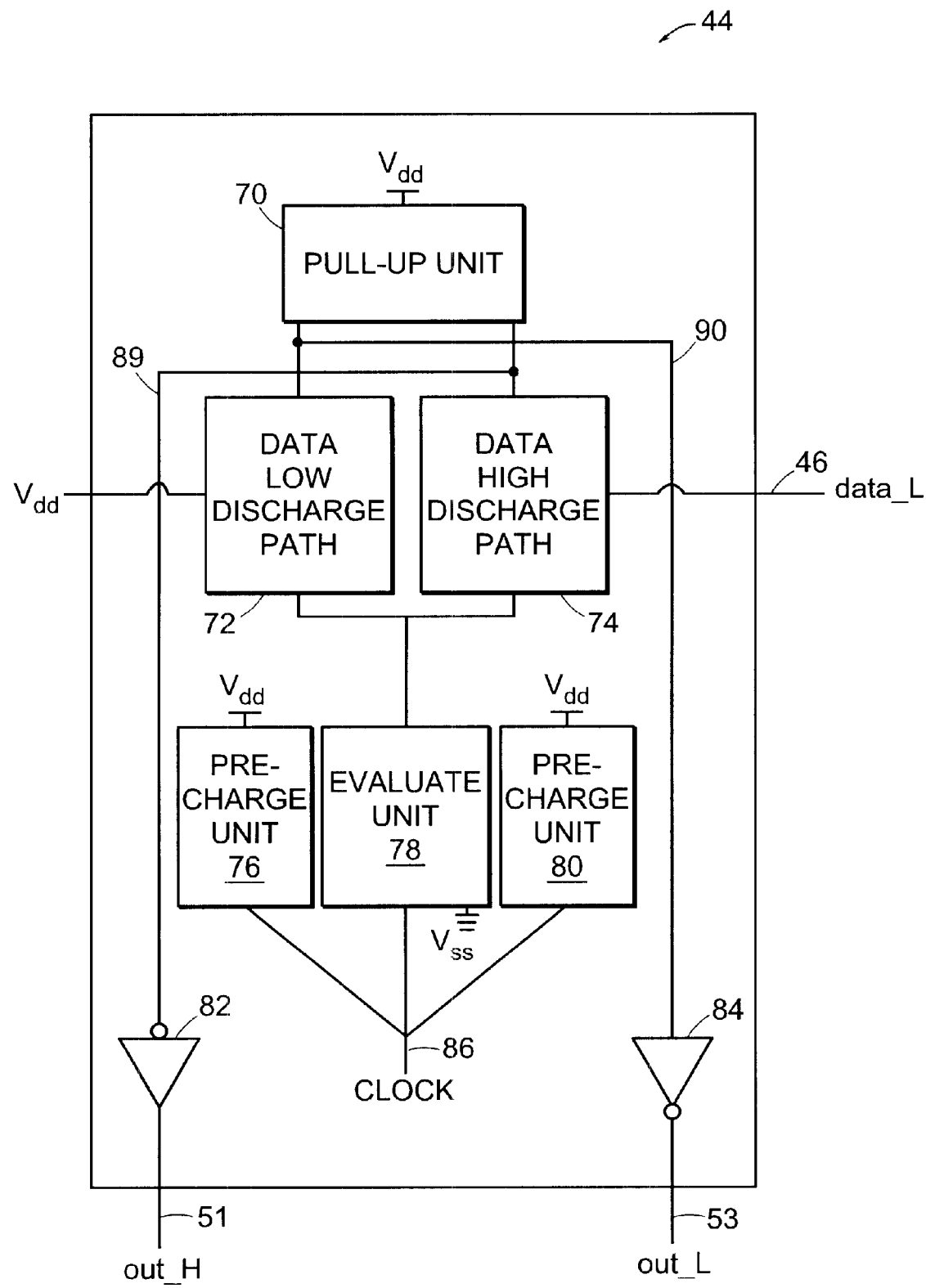
FIG. 4 is a functional block diagram of a sense amplifier according to the present invention.

Referring now to FIG. 4, a functional block diagram of sense amplifier 44 is shown to include pre-charge units 76 and 80 that are used for initializing or "pre-charging" the internal nodes (89, 90, L3, L3X, L6 and L6X, see FIG. 5) of sense amplifier 44 to predetermined logic values. Also, sense amplifier 44 includes a pair of discharge paths, the data low discharge path 72 and the data high discharge path 74, connected to an evaluate unit 78 and to a pull-up unit 70.

The pre-charge units are connected to a clock signal 86 and pre-charge the internal nodes (89, 90, L3, L3X, L6 and L6X) when that clock signal 86 transitions to a logic low level. Alternatively, when the clock signal 86 transitions to a logic high level, the pre-charge units are turned-off and the evaluate unit 78 is turned-on. Evaluate unit 78 allows current to flow from the data low discharge path 72 and from the data high discharge path 74, to Vss or ground.

In prior art systems, the data low discharge path 72 and the data high discharge path 74 were capable of discharging equivalent amounts of current, and hence charge, in response to similar input voltage levels. Therefore, in order for one of those discharge paths to discharge an internal signal at a faster rate, its associated input voltage level would have to be greater than the input voltage level associated with the other discharge path. Accordingly, prior art sense amplifiers made use of a reference voltage that provided a selected input voltage level to the data low discharge path 72 which was intermediate to the logic high and low levels of the input data signal applied to the data high discharge path 74.

If the input data signal developed a logic high level, the associated voltage level would be greater than the chosen reference voltage. Accordingly, the data high discharge path 74 would discharge at a faster rate than the data low discharge path 72. Alternatively, if the input data signal developed a logic low level, the associated voltage level would be less than the chosen reference circuit voltage. Accordingly, the data high discharge path 74 would discharge at a slower rate than the data low discharge path 72. In either case, the sense amplifier would thereafter generate a pair of rail-to-rail output signals in relation to the discharge path that discharged at the faster rate.

While such a sense amplifier is functionally adequate, the reference voltage circuits that are disposed therein are relatively large, consume substantial power and are susceptable to electrical noise.

In comparison to the prior art, the inventive sense amplifier 44 of FIG. 4 provides a significant reduction in the required amount of semiconductor area by using a simple connection to the Vdd power supply. That involves significantly less semiconductor area, consumes less power and has greater electrical noise immunity than the reference voltage circuit approach of the prior art.

The Vdd supply voltage can be utilized because the discharge paths 72 and 74 of sense amplifier 44 are capable of discharging different amounts of charge in response to similar input voltage levels. In one embodiment, the data high discharge path 74 is capable of discharging twice as much current as the data low discharge path 72. Therefore, in order for the data high discharge path 74 to discharge an internal signal at a faster rate, its associated input voltage level does not have to be greater than the input voltage level associated with the data low discharge path 72. Hence, the Vdd supply voltage that supplies the sense amplifier and the associated circuitry can be coupled to the data low discharge path 72 while providing the required level of functionality.

Accordingly, depending upon the logic level of data line 46, one of the discharge paths 72 or 74 will allow current to flow at a faster rate. Responsively, one of the associated output signals, 89 or 90, will be discharged at a faster rate. The signal 89 or 90 that discharges at the fastest rate will be detected and allowed to continue to discharge. The remaining signal 89 or 90 will be returned to Vdd by pull-up unit 70. Signals 89 and 90 are inverted by inverters 82 and 84 to generate signals out_h 51 and out_1 53. Accordingly, the out_1 signal 53 will contain a rail-to-rail voltage that has the same polarity as signal data_1 46, and out_h 51 will contain a rail-to-rail voltage that is the opposite polarity as signal data_1 46. For example, if data_1 46 is at a logic low level, signal out_1 53 will develop essentially the same voltage as Vss or ground. Also, signal out_h 51 will develop the same voltage as Vdd.

IV. Pre-Charge Operation

Referring now to the schematic diagram of FIG. 5 and the flow diagram of FIG. 6, the pre-charge operation of sense amplifier 44 will be described. Sense amplifier 44 returns to a reset or "pre-charge" state between each sensing operation (Step 100). For example, in the instant embodiment, sense amplifier 44 returns to such a pre-charge state between data read cycles. During such a pre-charge state, the input clock signal 86 remains at a logic low level (Step 102) and the data line 46 can be at any logic level. The clock signal 86 conveys the logic low level to the gates of PMOS transistors P3 and P4, turning them "on" or, in other words, allowing current to flow from their source terminals (s) to their drain terminals (d) (Step 104). Also, NMOS transistor N1 receives the clock signal 86 and is turned "off"(Step 106). When transistors P3 and P4 are turned on, output signal lines 89 and 90 are charged to approximately the same voltage as Vdd (Step 108). Output signal lines 89 and 90 are thereby pre-charged to logic high levels.

The logic level of output signal 90 is conveyed to the gate terminal of PMOS transistor P1, turning it off, and NMOS transistor N8, turning it on (Step 110). Also, the logic level on signal lines 89 is conveyed to the gate terminal of PMOS transistor P2, turning it off, and NMOS transistors N7 and N9, turning them on (Step 112). The NMOS transistors that are turned-on allow nodes L3, L6 and L6X to be pre-charged to logic high levels by PMOS transistors P3 and P4 (Step 114). The NMOS transistors remain on until the gate to source voltage (Vgs) of each transistor N8, N9 and N7 is less than the threshold voltage (Vt), or approximately 0.35 Volts (Step 116).

Further, because NMOS transistors N2 and N4 are turned-on, node L7 is pre-charged to a logic high level, i.e. to a level of Vdd minus the threshold voltage $V_t$ (Step 118). If data line 46 contains a logic high level, NMOS transistors N3 and N5 will also be turned-on and contribute to pre-charging node L7. Sense amplifier 44 is now referred to as being in a pre-charge state (Step 120).

Node L3X, and its associated transistors N4 and N6, are included in sense amplifier 44 for balancing the amount of parasitic capacitance that is coupled onto output signal line 89 with the amount of parasitic capacitance that is coupled onto output signal line 90. Without the inclusion of transistors N4 and N6, the parasitic capacitance on output signal line 90 would differ from the amount of parasitic capacitance of output signal line 89 due to the number of transistors coupled thereto. Such an imbalance can cause differences in the charging and discharging rates of those signal lines. However, the present invention is not so limited and can operate without the addition of node L3X and its associated transistors.

V. Sense Amplifier Operation: Data_1 Transition

Figure 5:
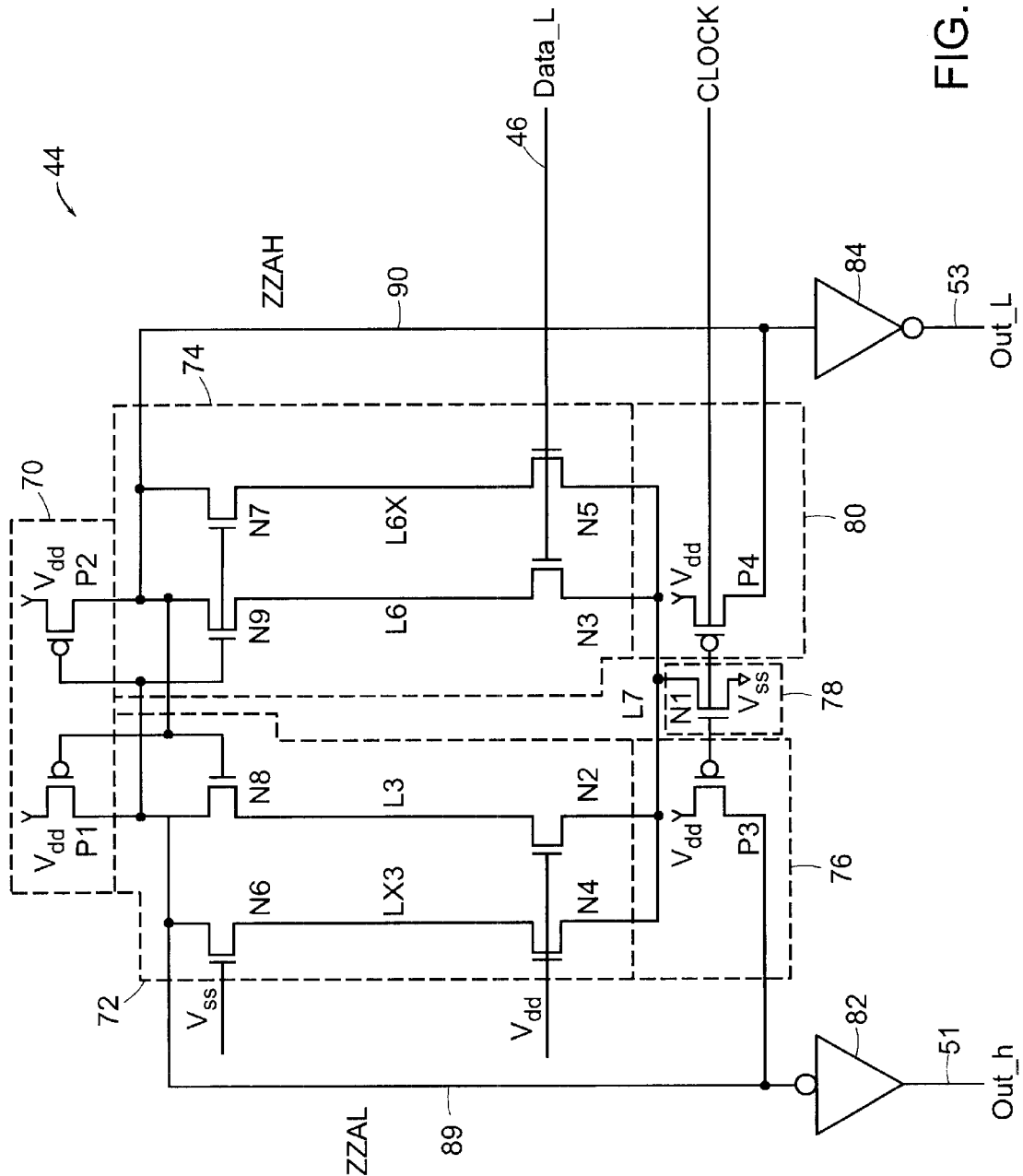
FIG. 5 is a schematic diagram of a sense amplifier according to the present invention.
Figure 6:
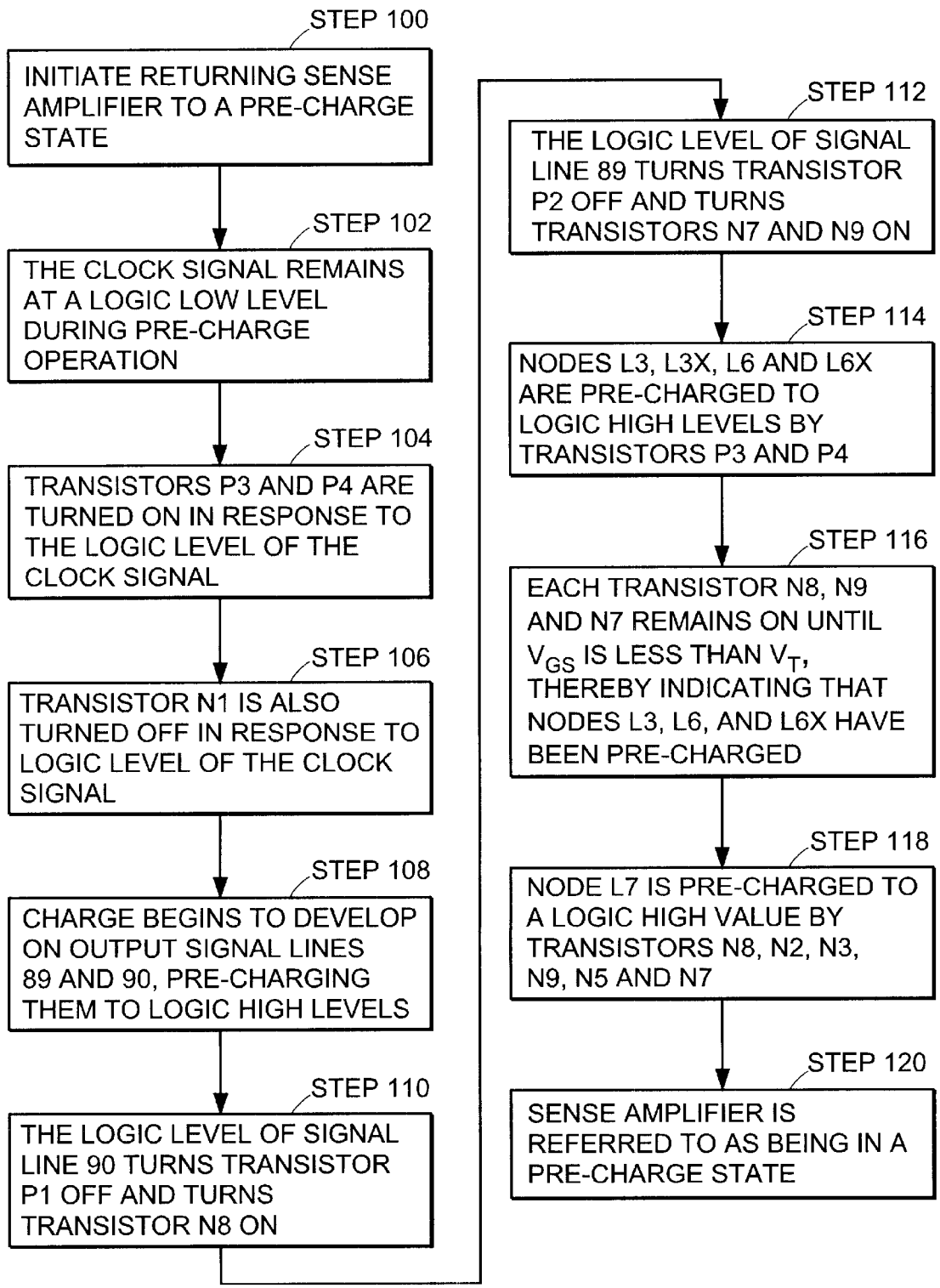
FIG. 6 is a flow diagram of the pre-charge operation of the sense amplifier of FIG. 5.
Figure 7:
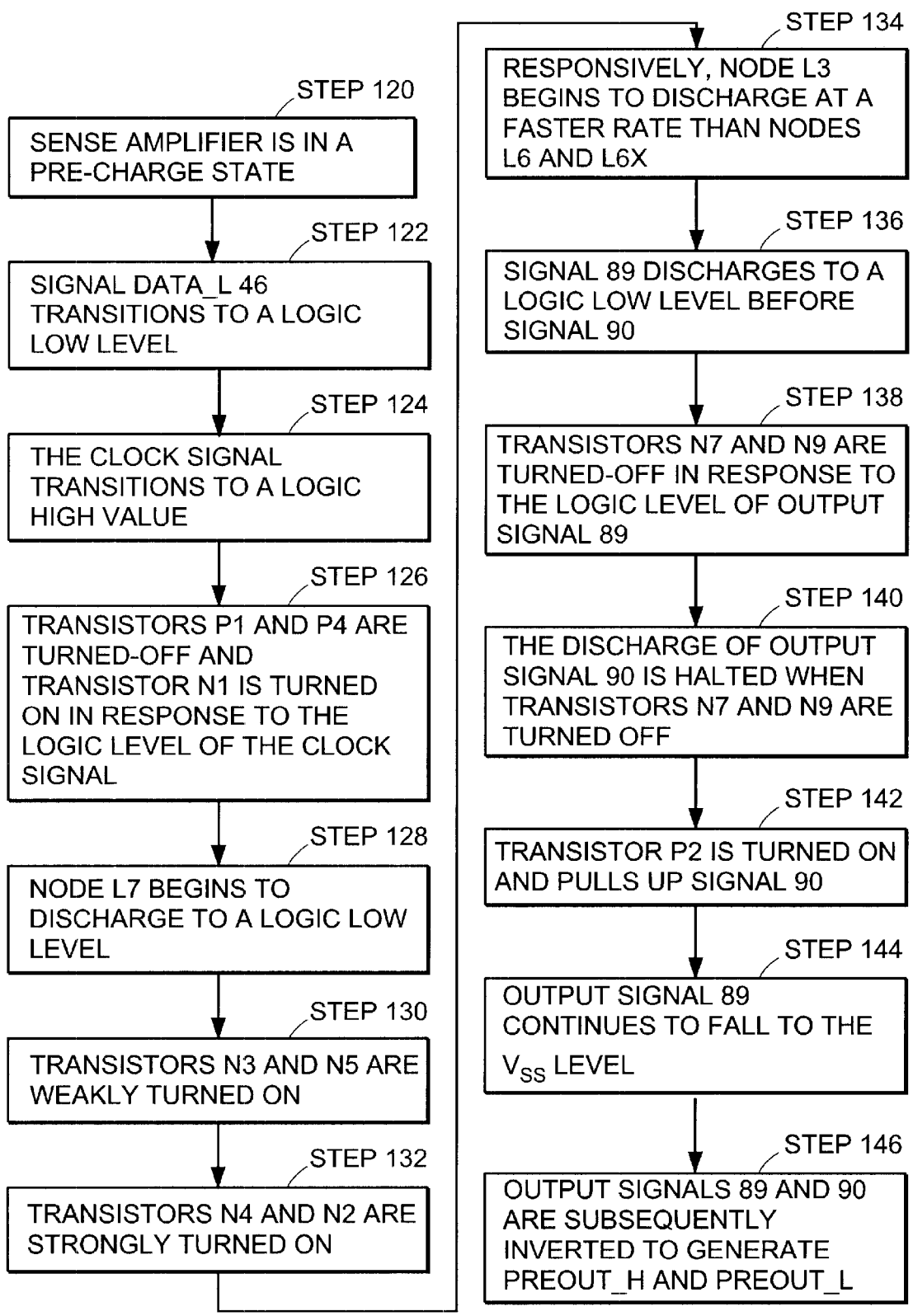
FIG. 7 is a flow diagram of the operation of the sense amplifier of FIG. 5, in response to data having a logic low level.

Referring now to the schematic diagram of FIG. 5 and the flow diagram of FIG. 7, the operation of sense amplifier 44 will be shown in response to signal data_1 46 transitioning from a logic high level to a logic low level. Assuming that signal data_1 46 is initially pre-charged to a logic high level, data will be read from a memory location 42a that will cause data_1 46 to transition to a logic low level (Step 122). After data line 46 has reached a logic low level that can be sensed by sense amplifier 44, clock signal 86 will transition to a logic high level (Step 124). That logic high level is conveyed to PMOS transistors P3 and P4, turning them off, and to NMOS evaluate transistor N1, turning it on (Step 126). Because evaluate transistor N1 has its source terminal connected to Vss (ground), node L7 begins to discharge to a logic low level (Step 128).

At this point in the read cycle, NMOS transistors N3 and N5 are "weakly" turned-on since signal data_1 46 does not have as high of a voltage level as Vdd (Step 130). However, NMOS transistors N4 and N2 are strongly turned-on and can conduct more current than transistors N3 and N5 (Step 132). Transistors N4 and N2 are referred to as being "strongly" turned-on because the Vdd supply voltage is applied to their gate terminals and the voltage on node L7 is discharging. Responsively, node L3 begins to discharge at a faster rate than nodes L6 and L6X (Step 134). Also, output signal 89 discharges through NMOS transistors N8, N2 and N1 faster than signal 90 can be discharged (Step 136). The difference in those discharge rates allows output signal 89 to reach a logic low level before output signal 90 can reach a logic low level. Responsively, NMOS transistors N7 and N9 are turned-off by output signal 89 before NMOS transistor N8 can be turned-off by output signal 90 (Step 138). Therefore, the discharging of output signal 90 will be halted when transistors N7 and N9 are turned-off (Step 140).

In addition, the logic low level on output signal 89 turns-on PMOS transistor P2 which pulls-up signal 90 to a logic high level (Step 142). Because transistor P1 remains off, output signal 89 will continue falling to a logic low level, such as to the Vss level (Step 144). Thereafter, output signals 89 and 90 will be inverted by inverters 82 and 84 to generate a logic high level on signal out_h 51 and a logic low level on signal out_1 53 (Step 146). It should be noted that those resulting output signals are rail-to-rail voltage signals.

VI. Sense Amplifier Operation: Data_h Transition

Referring now to the flow diagram of FIG. 8, the operation of sense amplifier 44 will be described in response to signal data_1 46 remaining at a logic high level. For illustration purposes, consider that the sense amplifier 44 has again been returned to the reset or pre-charge state in the manner previously described (see FIG. 6) (Step 120). When sense amplifier 44 is in such a pre-charge state, the input clock signal 86 is at a logic low level.

While data signal 46 is at a logic high level, the clock signal 86 transitions from a logic low level to a logic high level (Step 152). The clock signal 86 conveys the logic high level to the gate of PMOS transistors P3 and P4, turning them off (Step 154). Also, clock signal 86 turns-on NMOS evaluate transistor N1 (Step 156). Because evaluate transistor N1 has a source terminal connected to Vss, node L7 discharges to a logic low level (Step 158).

At this point in the cycle, NMOS transistors N3 and N5 are turned on "strongly" since data line 46 has approximately the same voltage level as Vdd (Step 160). Also, NMOS transistors N4 and N2 are also strongly turned-on (Step 162). Therefore, nodes L3, L3X, L6 and L6X can discharge through NMOS transistors N2, N3 and N5 at approximately the same rate. However, because NMOS transistor N6 is turned-off, output signal 89 can only discharge through NMOS transistors N8, N2 and N1. Alternatively, output signal 90 can discharge through NMOS transistors N9, N3, N7, N5, and N1. Since transistors N2–N9 in sense amplifier 44 have the same width, twice as much current can flow through transistors N9, N3, N7, N5 and N1, i.e., that construct the data high discharge path 74 and the evaluate unit 78 (Step 164).

Accordingly, output signal 90 discharges at a faster rate than output signal 89. The differences in the discharge rates allow NMOS transistor N8 to be turned-off by the logic level of output signal 90 before NMOS transistors N9 and N7 can be turned-off by output signal 89 (Step 166). Therefore, the discharging of output signal 89 through transistors N8, N2 and N1 will be halted (Step 168). In addition, when output signal 90 is discharged to a logic low level, PMOS transistor P1 is turned-on and pulls output signal 89 to a logic high level (Step 170). Output signal 90 continues falling to the Vss voltage level (Step 172). Thereafter, output signals 89 and 90 are inverted by inverters 82 and 84 to generate a logic high level on signal out_1 53 and a logic low level on signal out_h 51 (Step 174).

It should be noted that in the present embodiment, each transistor includes equivalent widths. Since the rate at which a particular discharge path, 72 or 74, discharges is also related to the size of the associated transistors, equivalent circuits could be implemented that include transistors that include different widths. Further, the order of the transistors within each discharge path 72 and 74 can be exchanged without affecting the operation of the sense amplifier 44.

Figure 8:
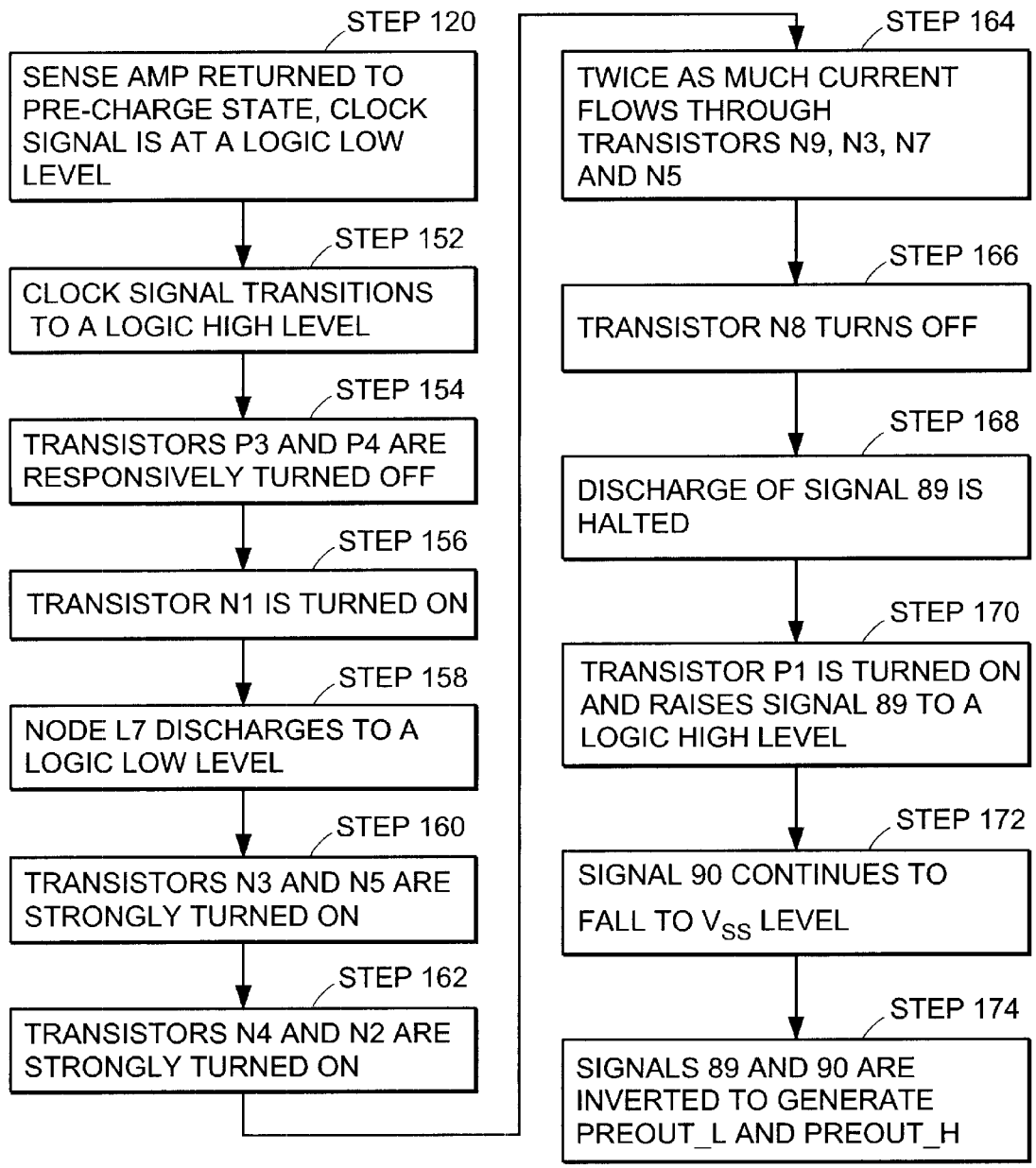
FIG. 8 is a flow diagram of a further operation of the sense amplifier of FIG. 5 in response to data having a logic high level.
Figure 9:
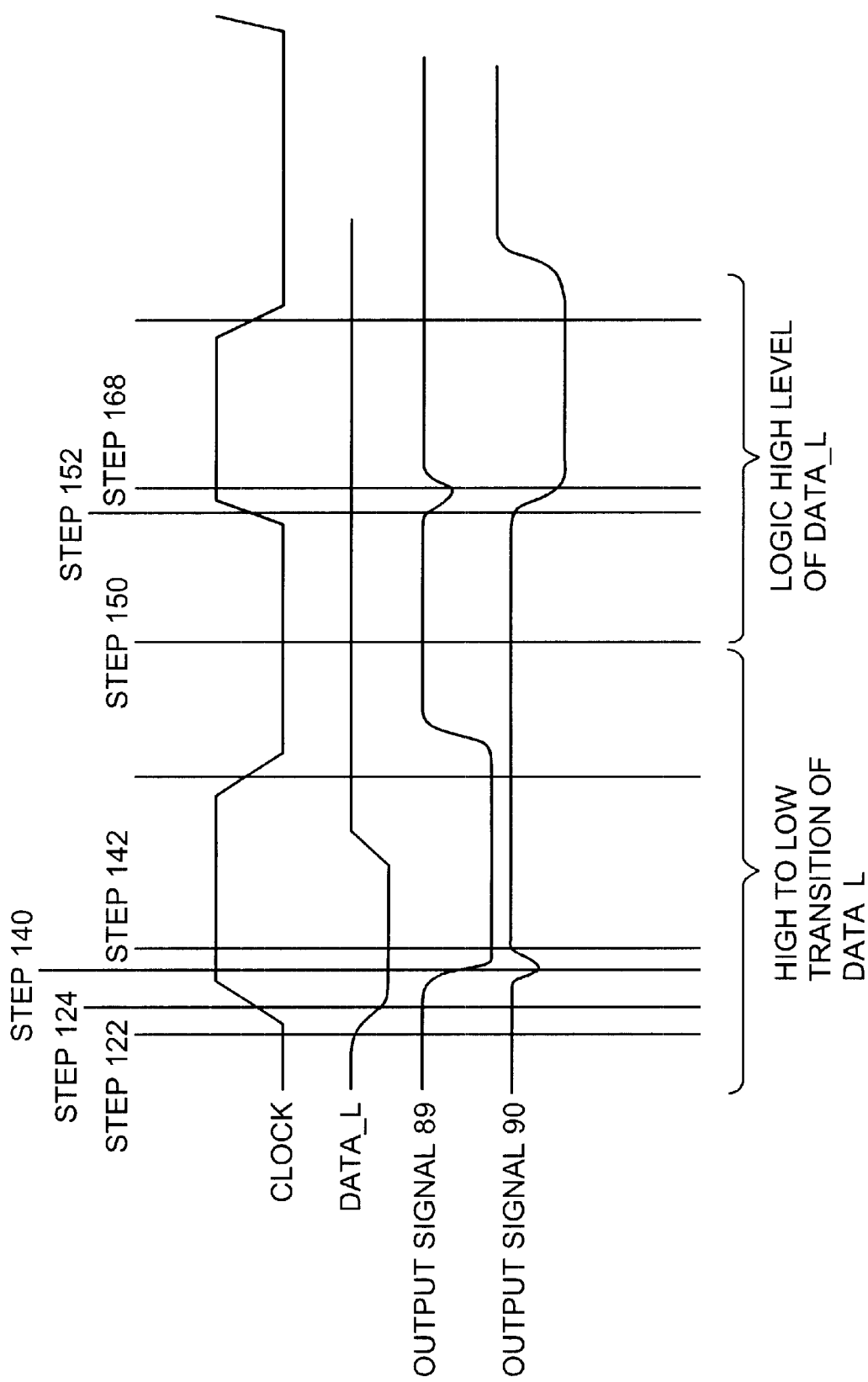
FIG. 9 is a timing diagram of the operation of the sense amplifier of FIG. 5.

Referring briefly to the timing diagram of FIG. 9, the timing waveforms of signals clock 86, data_1 46, output signal 90 and output signal 89 are related to the corresponding operational steps of FIGS. 7 and 8.

VII. Sense Amplifier Layout

Figure 10:
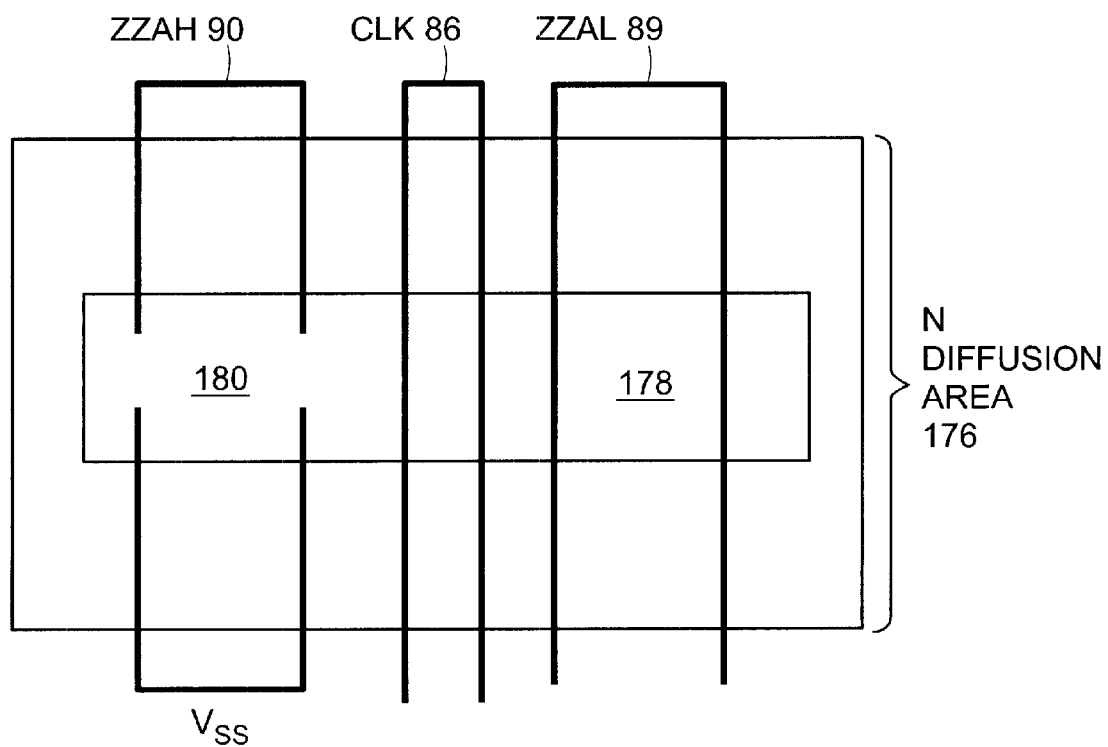
FIG. 10 is a block diagram of a physical layout of the sense amplifier of FIG. 5.

Referring now to FIG. 10, a high level physical layout of the NMOS portion of sense amplifier 44 is shown to include several areas 176–180. The first area 176 is referred to as the "N-diffusion" area and includes only N-type semiconductor material for forming the NMOS transistors N1–N9. The areas associated with signal lines CLK 86, output signal 90, output signal 89 and VSS represent diffused polysilicon material. Those diffusions of polysilicon material construct the gate terminals of NMOS transistors N1–N9. Further, areas 178 and 180 are referred to as "moveable window" areas. The locations of moveable window areas 178 and 180 can be tailored to change the sizes of NMOS transistors N2–N9 in relation to each other. Adjusting the sizes of transistors N2–N9, will set the sense amplifier's "trip point", i.e. the voltage above which inputs are considered to be a logic high and below which inputs are considered to be a logic low.

Figures 11, 11A:
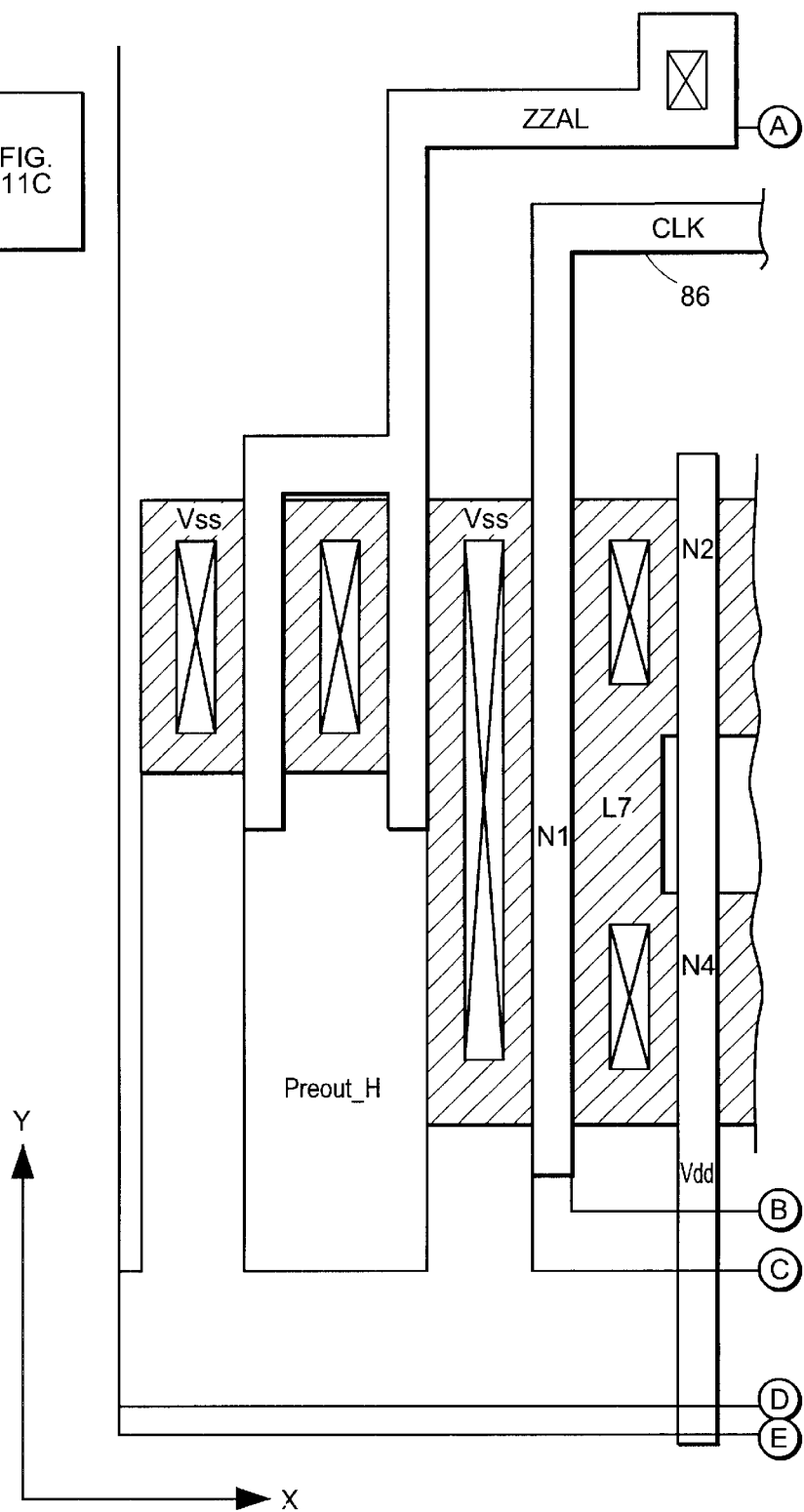
FIG. 11 is a detailed diagram of the physical layout depicted in FIG. 10.
Figure 11B:
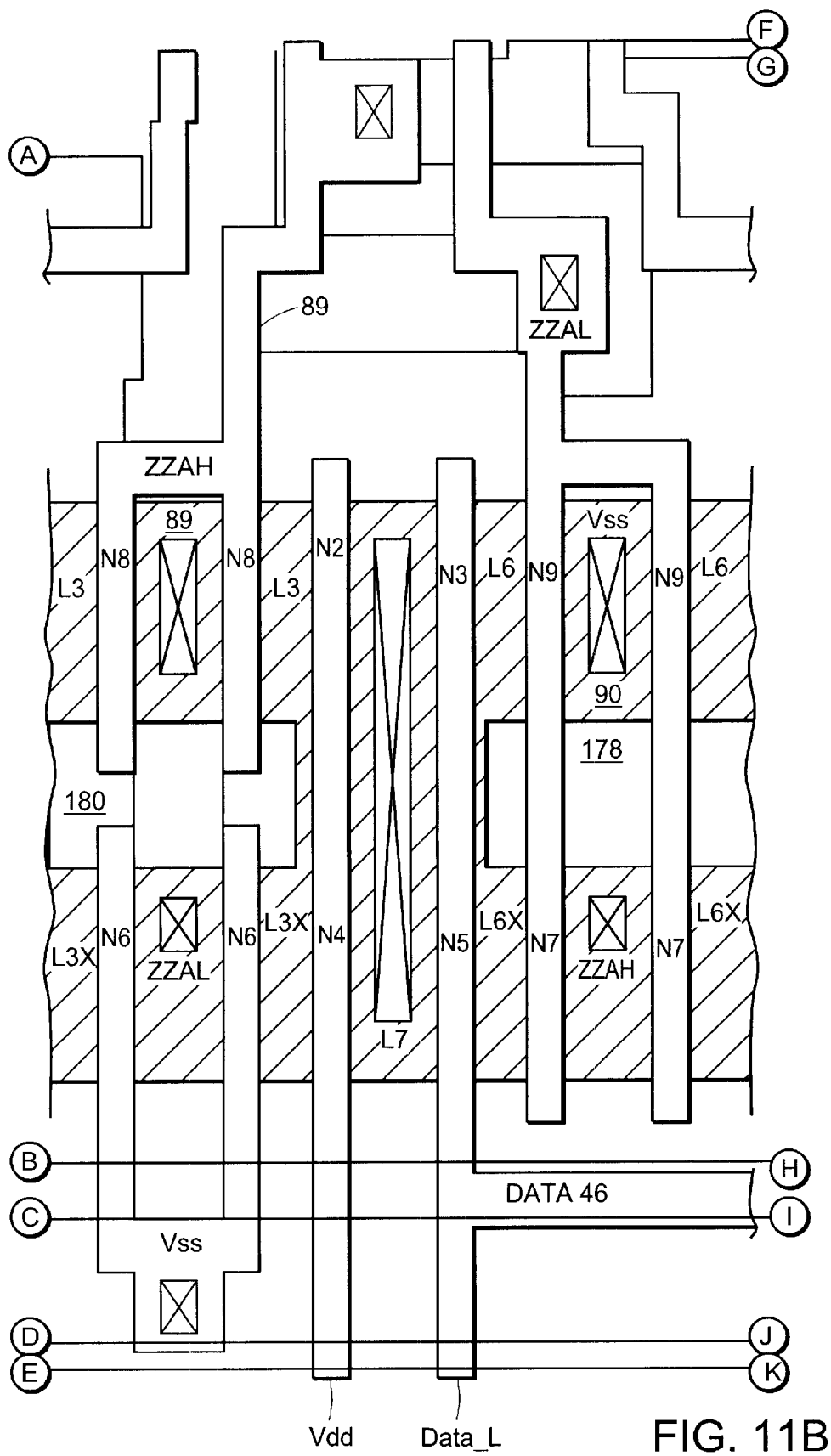
Figure 11C:
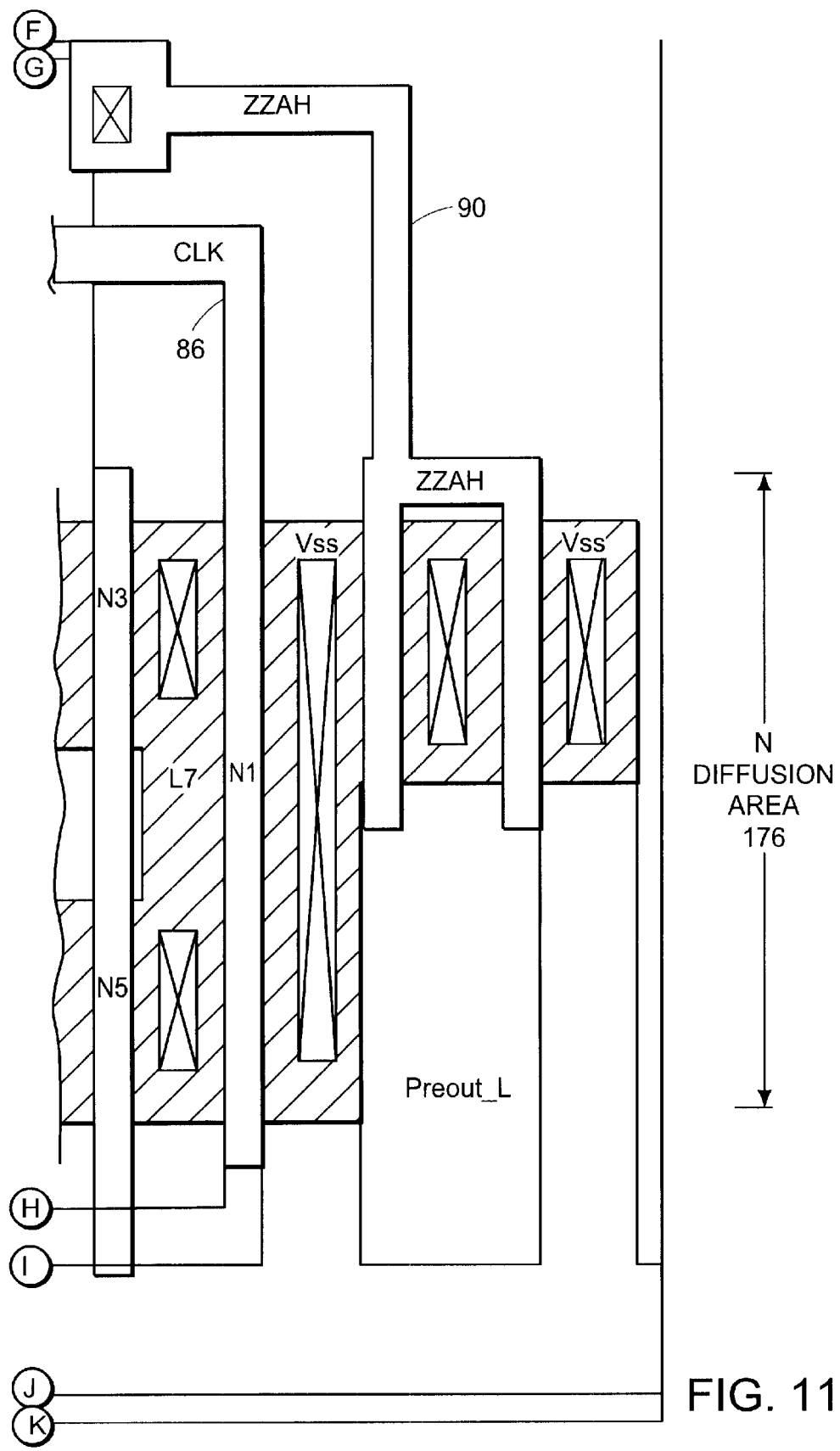

Referring now to FIG. 11, the N-diffusion area 176 is shown in greater detail. Each NMOS transistor N2–N9, and the polysilicon diffusion areas corresponding to signal lines CLK 86, output signal 90, output signal 89 and VSS are identified in relation to the moveable window areas 178 and 180. For example, transistors N3 and N9 are disposed along one edge of moveable window area 178, and transistors N5 and N7 are disposed along the opposing edge of moveable window area 178. Further, transistors N2 and N8 are disposed along one edge of moveable window area 180, and transistors N4 and N6 are disposed along the opposing edge of moveable window area 180. Adjustments that are made to the location of moveable window areas 178 and 180 will affect the relative size of transistors N2–N9 and are used to adjust the trip point of sense amplifier 44.

The location of moveable window areas 178 and 180 can be shifted up or down in the y-axis direction. Accordingly, when moveable window areas 178 and 180 are shifted in the positive y-axis direction, the size of transistors N2, N8, N3 and N9 are reduced and the size of transistors N4, N6, N5 and N7 are correspondingly increased. Likewise, when moveable window areas 178 and 180 are shifted in the negative y-axis direction, the size of transistors N2, N8, N3 and N9 are increased and the size of transistors N4, N6, N5 and N7 are correspondingly decreased.

The trip point of sense amplifier 44 can be defined in terms of the relative sizes of transistors N7, N8 and N9. The following empirical relation equates the size of transistor N8 to the voltage on the data signal 46 that must be attained before a logic low level can be sensed. It should be noted that this equation should be scaled according to the process used to make the transistors.

Voltage (% of Vdd) Size Relationship

A percentage of Vdd $(N8/(N7+N9))=((\text{desired logic low level}/Vdd*1.1111)+0.2$ Accordingly, for sense amplifier 44 to be able to sense that a certain voltage on data signal 46 represents a logic low level, the sizes of transistors N7, N8 and N9 should conform to the specified relationship. For example, assume that Vdd is 2.0 Volts and that it is desired that a voltage of 1.0 Volts (50% of Vdd) should be sensed as a logic low level. Therefore, in order for sense amplifier 44 to detect that voltage as a logic low level, the ratio of transistor sizes, N8/(N7+N9), should equate to $((1.0V/2.0V)*1.1111) +0.2$ or 0.711. Accordingly, it will be recognized that selecting the trip point of sense amplifier 44 by adjusting the locations of moveable window areas 178–180 is less complex than individually re-sizing each transistor.

VIII. Alternative Embodiments

It will be recognized by one of ordinary skill in the art that the functionality of the inventive sense amplifier will be preserved if the NMOS and PMOS transistor types are exchanged, along with the polarity of the associated logic signals. Further, the sense amplifier of the present invention is not limited to the present embodiment. To the contrary, the instant sense amplifier can be used in any circuit or application that utilizes a sense amplifier such that similar performance can be retained while significantly reducing the required amount of CPU or chip real estate. Such circuits can include edge-triggered latches and flip flops.

While this invention has been particularly shown and described with references to preferred embodiments thereof, it will be understood by those skilled in the art that various changes in form and details may be made therein without departing from the scope of the invention encompassed by the appended claims.

What is claimed is:

1. A computer system, comprising:
   a central processing unit connected to a memory system by a system bus;
   an I/O system, connected to the system bus by a bus interface device; and
   at least one sense amplifier contained in said central processing unit to sense a logic level of a data signal, being a first signal of a differential pair of signals, and to generate a complementary pair of rail-to-rail output signals in response to said logic level of said data signal, said sense amplifier comprising:
      a first discharge path, coupled to a first internal signal node of said sense amplifier and having a first conductance capacity, for allowing a first charge stored on that first internal signal node to be discharged at a first rate, said first discharge path receiving a reference voltage substantially equal to a power supply voltage, said first rate being proportional to the reference voltage; and
      a second discharge path, coupled to a second internal signal node of said sense amplifier and having a second conductance capacity being of greater conductance capacity than said first conductance capacity, for allowing a second charge stored on that second internal signal node to be discharged at a second rate, said second rate (i) being proportional to a voltage level of said data signal that is associated with said logic level of said data signal and (ii) exceeding said first rate when said voltage level of said data signal reaches a logic high level that is less than said power supply voltage, said second discharge path and said first discharge path connected by a pull-up unit.

2. A computer system, as described in claim 1, further comprising:
   an evaluate unit, connected to an electrical ground and to said first and said second discharge paths for conveying said first and said second charges to said electrical ground, said evaluate unit initiating said conveyance when said data signal achieves a predetermined voltage level that is capable of being resolved by said sense amplifier.

3. A computer system, as described in claim 2, wherein said first discharge path comprises:
   first and second transistors connected in series at said first internal signal node; and
   third and fourth transistors connected in series at said first internal signal node, that series connection further connected in parallel with the series connection of said first and second transistors and wherein a gate terminal of said second transistor and a gate terminal of said fourth transistor are coupled to said reference voltage.

4. A computer system, as described in claim 3, wherein said second discharge path comprises:
   fifth and sixth transistors connected in series at said second internal signal node, said sixth transistor being connected to said evaluate unit such that said second charge, developed on said second internal signal, is conveyable to said electrical ground.

5. A computer system, as described in claim 4, wherein said evaluate unit comprises:
   at least one evaluate transistor having a drain terminal connected to a source terminal of said second transistor, said drain terminal further connected to a source terminal of said fourth transistor and further connected to a source terminal of said sixth transistor, said evaluate transistor further comprising a source terminal connected to said electrical ground.

6. A computer system, as described in claim 3, wherein a first portion of said pull-up unit is connected to a drain terminal of said fifth transistor and a second portion of said pull-up unit is connected to drain terminals of said first and third transistors.

7. A computer system, as described in claim 6, further comprising:
   a clock signal line, connected to a gate terminal of said evaluate transistor, for initiating said discharge of said first and said second charges developed on said first and second internal signal nodes, respectively.

8. A computer system, as described in claim 7, further comprising:
   a first output signal line, connected to said drain terminals of said first and third transistors, for outputting a rail-to-rail voltage signal that has the opposite polarity as the logic level of said data signal.

9. A computer system, as described in claim 8, further comprising:
   a second output signal line, connected to the drain terminal of said fifth transistor, for outputting a rail-to-rail voltage signal that has the same polarity as the logic level of said data signal.

10. A computer system, as described in claim 1, wherein said sense amplifier comprises:
    a first portion of said pull-up unit, coupled to said second internal signal node for pulling the charge at said second internal signal node to said logic high level in response to said first rate being faster than said second rate; and
    a second portion of said pull-up unit, coupled to said first internal signal node for pulling the charge at said first internal signal node to said logic high level in response to said second rate being faster than said first rate.

11. A computer system, as described in claim 1, wherein said data signal is a single data signal coupled to said sense amplifier such that the amount of chip area used to construct said sense amplifier is minimized.

12. A sense amplifier for sensing a logic level of a data signal, comprising:
    a first discharge path, coupled to a first internal signal node of said sense amplifier and having a first conductance capacity, for allowing a first charge stored on said first internal signal node to be discharged at a first rate, said first discharge path receiving a reference voltage substantially equal to a power supply voltage, said first rate being proportional to the reference voltage; and
    a second discharge path, coupled to a second internal signal node of said sense amplifier and having a second conductance capacity being of greater conductance capacity than said first conductance capacity, for allowing a second charge stored on said second internal signal node to be discharged at a second rate, said second rate (i) being proportional to a voltage level of said data signal that is associated with said logic level of said data signal and (ii) exceeding said first rate when said voltage level of said data signal reaches a logic high level that is less than said power supply voltage, said r second discharge path and said first discharge path connected by a pull-up unit.

13. A sense amplifier, as described in claim 12, further comprising:

a first portion of said pull-up unit, coupled to said second internal signal node for pulling said second internal signal node to said logic high level in response to said first rate being faster than said second rate; and a second portion of said pull-up, coupled to said first internal signal node for pulling said first internal signal node to said logic high level in response to said second rate being faster than said first rate.

14. A sense amplifier, as described in claim 13, further comprising:

an evaluate unit, connected to an electrical ground and to said first and said second discharge paths for conveying said first and said second charges to said electrical ground, said evaluate unit initiating said conveyance when said data signal achieves a predetermined voltage level being resolved by said sense amplifier.

* * * * *